US008390129B2

(12) United States Patent
Shen et al.

(10) Patent No.: US 8,390,129 B2
(45) Date of Patent: Mar. 5, 2013

(54) SEMICONDUCTOR DEVICE WITH A PLURALITY OF MARK THROUGH SUBSTRATE VIAS

(75) Inventors: Chi-Chih Shen, Kaohsiung (TW); Jen-Chuan Chen, Kaohsiung (TW); Hui-Shan Chang, Kaohsiung (TW); Chung-Hsi Wu, Kaohsiung (TW); Meng-Jen Wang, Kaohsiung (TW)

(73) Assignee: Advanced Semiconductor Engineering, Inc, Kaohsiung (TW)

( * ) Notice: Subject to any disclaimer, the term of this patent is extended or adjusted under 35 U.S.C. 154(b) by 190 days.

(21) Appl. No.: 12/945,134

(22) Filed: Nov. 12, 2010

(65) Prior Publication Data
US 2012/0119335 A1 May 17, 2012

(51) Int. Cl.
*H01L 23/48* (2006.01)
*H01L 23/52* (2006.01)
*H01L 29/40* (2006.01)

(52) U.S. Cl. ............... 257/774; 257/678; 257/E21.237; 257/E21.238; 257/E21.483; 257/E21.499; 257/E21.509; 257/E21.553

(58) Field of Classification Search .............. 257/678, 257/673, 737, 734, 735, 774, E21.237, E21.238, 257/E21.483, E21.499, E21.509, E21.553
See application file for complete search history.

(56) References Cited

U.S. PATENT DOCUMENTS

| 6,239,482 B1 * | 5/2001 | Fillion et al. ............. 257/678 |
| 6,506,632 B1 * | 1/2003 | Cheng et al. ............. 438/126 |
| 8,115,297 B2 * | 2/2012 | Yang ....................... 257/692 |
| 2004/0087043 A1 * | 5/2004 | Lee et al. ................... 438/6 |

* cited by examiner

*Primary Examiner* — David Nhu
(74) *Attorney, Agent, or Firm* — McCracken & Frank LLC

(57) ABSTRACT

The present invention relates to a semiconductor device with a plurality of mark through substrate vias, including a semiconductor substrate, a plurality of original through substrate vias and a plurality of mark through substrate vias. The original through substrate vias and the mark through substrate vias are disposed in the semiconductor substrate and protrude from the backside surface of the semiconductor substrate. The mark through substrate vias are added at a specific position and/or in a specific pattern and serve as a fiducial mark, which facilitates identifying the position and direction on the backside surface. Thus, the redistribution layer (RBL) or the special equipment for achieving the backside alignment (BSA) is not necessary.

18 Claims, 11 Drawing Sheets

US 8,390,129 B2

SEMICONDUCTOR DEVICE WITH A PLURALITY OF MARK THROUGH SUBSTRATE VIAS

BACKGROUND OF THE INVENTION

1. Field of the Invention

The present invention relates to a semiconductor device with a plurality of through substrate vias, and more particularly to a semiconductor device with a plurality of mark through substrate vias.

2. Description of the Related Art

FIG. 1 shows a schematic cross-sectional view of a conventional semiconductor wafer. FIG. 2 shows a partially cross-sectional view of FIG. 1. The semiconductor wafer 1 includes a semiconductor substrate 10 and a plurality of through substrate vias 12. The semiconductor substrate 10 has a front surface (not shown) and a backside surface 101. The through substrate vias 12 are disposed in the semiconductor substrate 10, and the back ends 121 of the through substrate vias 12 protrude from the backside surface 101.

After an exposure process, the position and direction on the backside surface 101 of the semiconductor substrate 10 must be identified to continue the following steps, such as: a photoliography process, which is used to form a redistribution layer (RDL) on the backside surface 101. A special backside alignment (BSA) equipment is used to achieve the intention. However, the use of such equipment will raise the manufacture cost, and the alignment error is high.

FIG. 3 shows a schematic cross-sectional view of a conventional semiconductor die. The semiconductor die 2 is cut form a semiconductor wafer. The semiconductor die 2 includes a semiconductor substrate 20, a backside passivation 21 and a plurality of through substrate vias 22. The semiconductor substrate 20 has a front surface (not shown) and a backside surface 201. The backside passivation 21 is disposed on the backside surface 201. The through substrate vias 22 are disposed in the semiconductor substrate 20 and the back ends 221 of the through substrate vias 22 protrude from the backside surface 201 and the backside passivation 21. A surface finish layer 222 is formed on the back ends 221 of the through substrate vias 22.

In a semiconductor process, a top semiconductor device (not shown) is bonded to the backside surface 201 of the semiconductor substrate 20, and the protruded back ends 221 of the through substrate vias 22 must contact the bumps or solder balls on the bottom surface of the top semiconductor device for electrical connection. Before the bonding process, the position and direction on the backside surface 201 of the semiconductor substrate 20 must be identified. Usually, a redistribution layer (RDL) is formed on the backside surface 201 to serve as a fiducial mark. The fiducial mark is easily to be detected, which facilitates identifying the position and direction on the backside surface 201. However, the formation of the RDL will raise the manufacture cost.

Therefore, it is necessary to provide a semiconductor device with a plurality of mark through substrate vias to solve the above problems.

SUMMARY OF THE INVENTION

The present invention is directed to a semiconductor device with a plurality of mark through substrate vias, comprising a semiconductor substrate, a plurality of original through substrate vias and a plurality of mark through substrate vias. The semiconductor substrate has a front surface and a backside surface. The original through substrate vias are disposed in the semiconductor substrate and protrude from the backside surface. The original through substrate vias comprise a plurality of first original through substrate vias and a plurality of second original through substrate vias. The first original through substrate vias are arranged in a first array, and the second original through substrate vias are arranged in a second array. The pitch between two adjacent first original through substrate vias is defined as a first pitch, and the pitch between two adjacent second original through substrate vias is defined as a second pitch.

The mark through substrate vias are disposed in the semiconductor substrate and protrude from the backside surface. The mark through substrate vias comprise a plurality of first mark through substrate vias and a plurality of second mark through substrate vias. The first mark through substrate vias are arranged in a first set, and the second mark through substrate vias are arranged in a second set. The first set is disposed near the first array, and the second set is disposed near the second array. The pitch between two adjacent first mark through substrate vias is defined as a third pitch, and the pitch between the first original via nearest the first mark via and the first mark via is defined as a fourth pitch. The pitch between two adjacent second mark through substrate vias is defined as a fifth pitch, and the pitch between the second original via nearest the second mark via and the second mark via is defined as a sixth pitch. The third pitch is not equal to the fourth pitch, and the third pitch and the fourth pitch are both indivisible by the first pitch. The fifth pitch is not equal to the sixth pitch, and the fifth pitch and the sixth pitch are both indivisible by the second pitch.

The present invention is also directed to a semiconductor device with a plurality of mark through substrate vias, comprising a semiconductor substrate, a plurality of original through substrate vias and a plurality of mark through substrate vias. The semiconductor substrate has a front surface and a backside surface. The original through substrate vias are disposed in the semiconductor substrate and protrude from the backside surface. The original through substrate vias are arranged in a plurality of original arrays, and each of the original arrays has an original pattern.

The mark through substrate vias are disposed in the semiconductor substrate and protrude from the backside surface. The mark through substrate vias comprise a plurality of first mark through substrate vias and a plurality of second mark through substrate vias. The first mark through substrate vias are arranged in a first set with a first pattern, and the second mark through substrate vias are arranged in a second set with a second pattern. The first set is disposed at a first corner of the backside surface, the second set is disposed at a second corner of the backside surface, and the first corner is opposite the second corner. The first pattern and the second pattern are both different from the original pattern.

In the present invention, the mark through substrate vias are added to serve as a fiducial mark, which facilitates identifying the position and direction on the backside surface. Thus, the redistribution layer (RDL) or the special equipment for achieving the backside alignment (BSA) is not necessary.

DETAILED DESCRIPTION OF THE INVENTION

Figure 1:
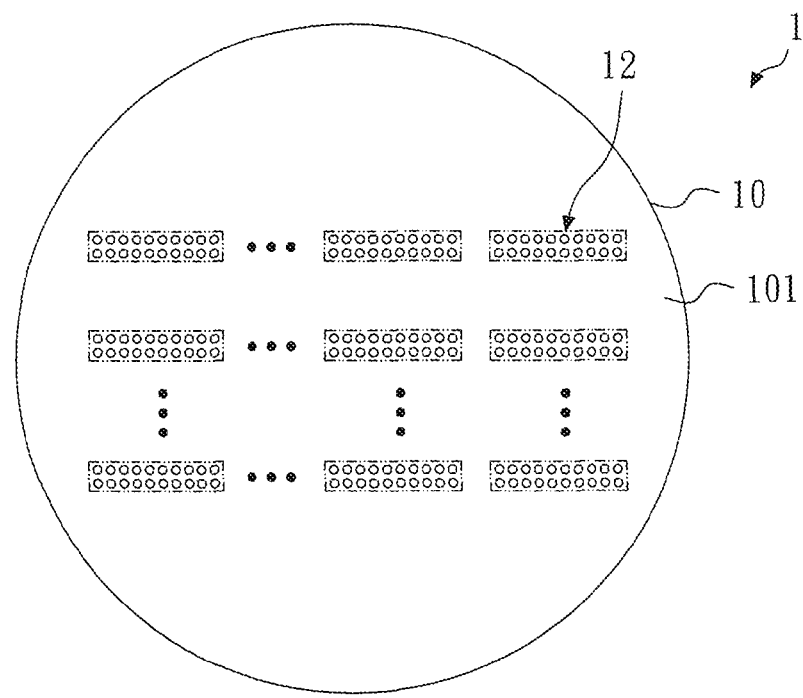
FIG. 1 is a schematic cross-sectional view of a conventional semiconductor wafer.
Figure 2:
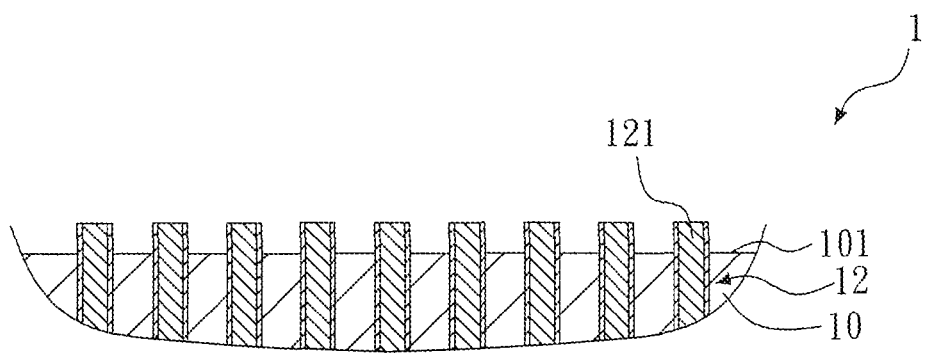
FIG. 2 is a partially cross-sectional view of FIG. 1.
Figure 3:
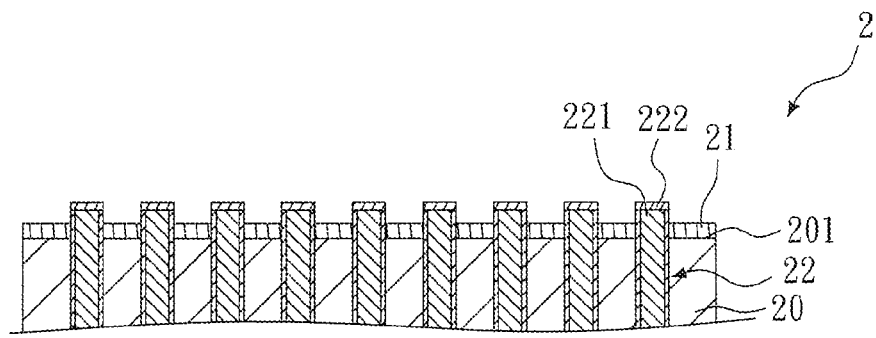
FIG. 3 is a schematic cross-sectional view of a conventional semiconductor die.
Figure 4:
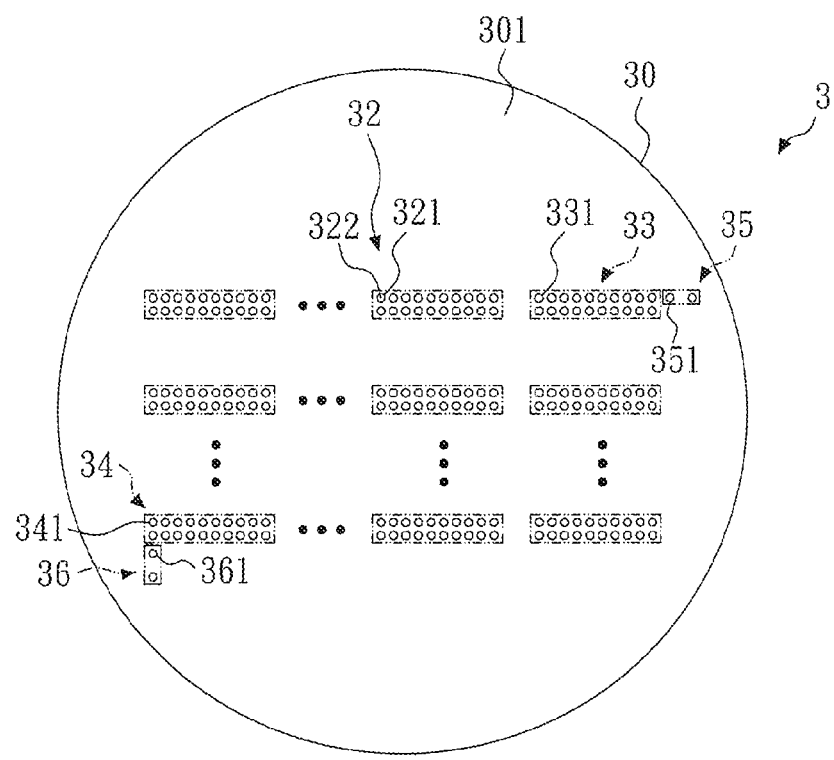
FIG. 4 is a schematic top view of a semiconductor device according to a first embodiment of the present invention.

FIG. 4 shows a schematic top view of a semiconductor device according to a first embodiment of the present invention. In this embodiment, the semiconductor device 3 is a semiconductor wafer and comprises a semiconductor substrate 30 and a plurality of original through substrate vias 32 and a plurality of mark through substrate vias (for example, the first mark through substrate vias 351 and the second mark through substrate vias 361). The semiconductor substrate 30 has a front surface (not shown) and a backside surface 301. The original through substrate vias 32 and the mark through substrate vias are disposed in the semiconductor substrate 30, and the back ends 321 of the original through substrate vias 32 and the mark through substrate vias are exposed (for example, protrude) from the backside surface 301. Preferably, the semiconductor device 3 further comprises a backside passivation 21 disposed on the backside surface 301. The original through substrate vias 32 and the mark through substrate vias are further exposed (for example, protrude) from the backside passivation. A surface finish layer 322 is formed on the back ends 321 of the original through substrate vias 32 and the mark through substrate vias.

In the present invention, the "original through substrate vias" are the through substrate vias that are originally designed to contact the bumps or solder balls on a bottom surface of a top semiconductor device for electrical connection. The "mark through substrate vias" are the through substrate vias that are added to serve as a fiducial mark. In the embodiment, the original through substrate vias 32 are conductive, and the mark through substrate vias are dummy. However, in other embodiments, the original through substrate vias 32 and the mark through substrate vias are all conductive.

Figure 7:
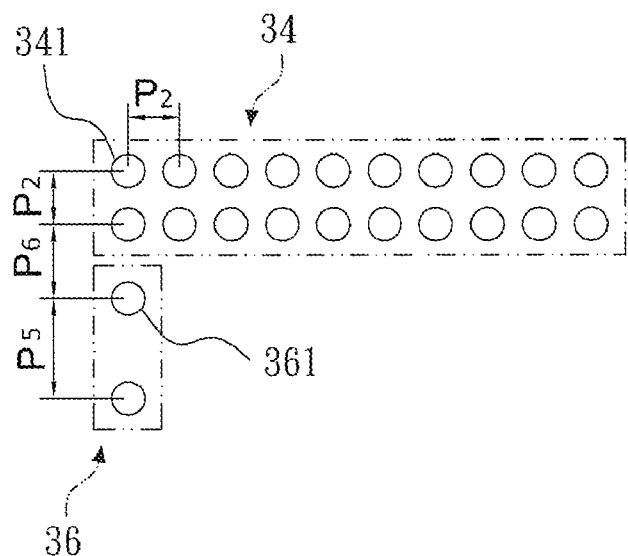
FIG. 7 is an enlarged view of the second set and the second array of FIG. 4.

The original through substrate vias 32 comprise a plurality of first original through substrate vias 331 and a plurality of second original through substrate vias 341. The first original through substrate vias 331 are arranged in a first array 33, and the second original through substrate vias 341 are arranged in a second array 34. The pitch between two adjacent first original through substrate vias 331 is defined as a first pitch $P_1$ (FIG. 5), and the pitch between two adjacent second original through substrate vias 341 is defined as a second pitch $P_2$ (FIG. 7).

The mark through substrate vias comprise a plurality of first mark through substrate vias 351 and a plurality of second mark through substrate vias 361. The first mark through substrate vias 351 are arranged in a first set 35, and the second mark through substrate vias 361 are arranged in a second set 36. The first set 35 is disposed near the first array 33, and the second set 36 is disposed near the second array 34. Preferably, the first array 33 is disposed at a first corner of the whole original through substrate vias 32, the second array 34 is disposed at a second corner of the whole original through substrate vias 32, and the first corner is opposite the second corner. Further, the first set 35 is disposed near a corner of the first array 33, and the second set 36 is disposed near a corner of the second array 34.

Figure 5:
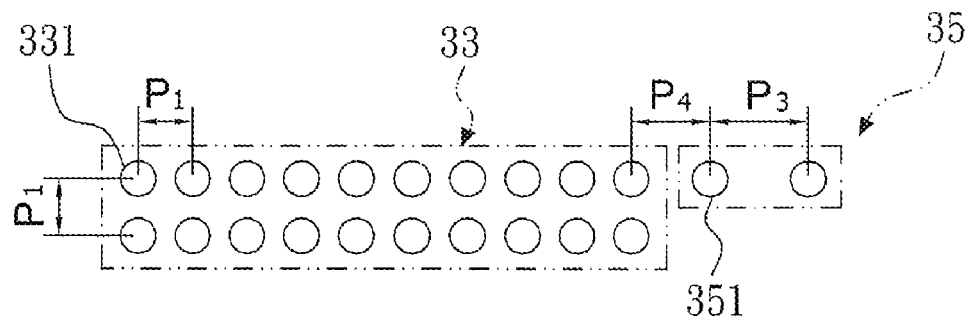
FIG. 5 is an enlarged view of the first set and the first array of FIG. 4.

FIG. 5 shows an enlarged view of the first set and the first array of FIG. 4. The pitch between two adjacent first mark through substrate vias 351 is defined as a third pitch $P_3$, and the pitch between the first original via 331 nearest the first mark via 351 and the first mark via 351 is defined as a fourth pitch $P_4$. The third pitch $P_3$ is not equal to the fourth pitch $P_4$. Further, the third pitch $P_3$ and the fourth pitch $P_4$ are both indivisible by the first pitch $P_1$. For example, the first pitch $P_1$ is 50 μm, the third pitch $P_3$ is 90 μm and the fourth pitch $P_4$ is 70 μm.

Figure 6:
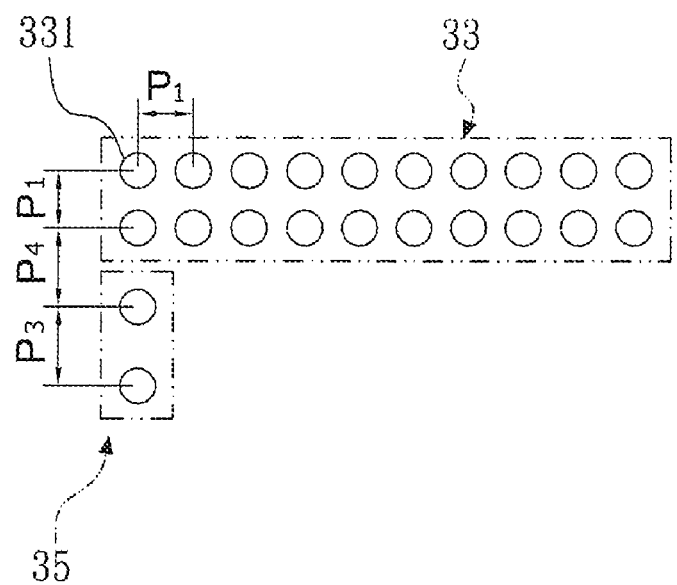
FIG. 6 is another arrangement of the first set of FIG. 5.

In this embodiment, the first mark through substrate vias 351 includes two mark through substrate vias that are arranged in a first mark row, and the first original through substrate vias 331 are arranged in two first original rows. The first mark row is aligned with one of the first original rows, and they are in the same row. However, shown in FIG. 6, in another arrangement, the first mark through substrate vias 351 includes two mark through substrate vias that are arranged in a first mark column, and the first original through substrate vias 331 are arranged in ten first original columns. The first mark column is aligned with one of the first original columns, and they are in the same column.

FIG. 7 shows an enlarged view of the second set and the second array of FIG. 4. The pitch between two adjacent second mark through substrate vias 361 is defined as a fifth pitch $P_5$, and the pitch between the second original via 341 nearest the second mark via 361 and the second mark via 361 is defined as a sixth pitch $P_6$. The fifth pitch $P_5$ is not equal to the sixth pitch $P_6$. Further, the fifth pitch $P_5$ and the sixth pitch $P_6$ are both indivisible by the second pitch $P_2$. For example, the second pitch $P_2$ is 50 μm, the fifth pitch $P_5$ is 90 μm and the sixth pitch $P_6$ is 70 μm.

Figure 8:
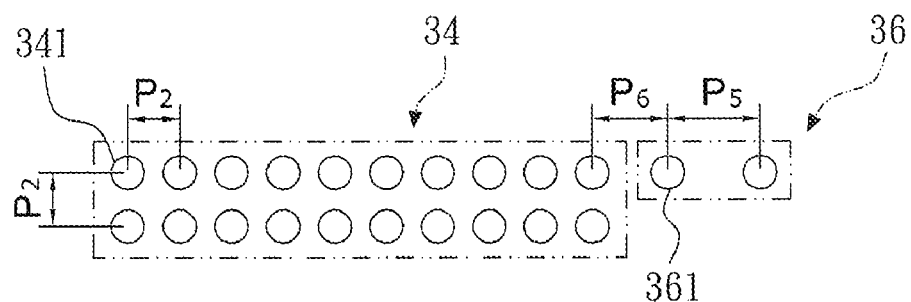
FIG. 8 is another arrangement of the second set of FIG. 7.

In this embodiment, the second mark through substrate vias 361 includes two mark through substrate vias that are arranged in a second mark column, and the second original through substrate vias 341 are arranged in ten second original columns. The second mark column is aligned with one of the second original columns, and they are in the same column. However, shown in FIG. 8, in another arrangement, the second mark through substrate vias 361 includes two mark through substrate vias that are arranged in a second mark row, and the second original through substrate vias 341 are arranged in two second original rows. The second mark row is aligned with one of the second original rows, and they are in the same row.

Figure 9:
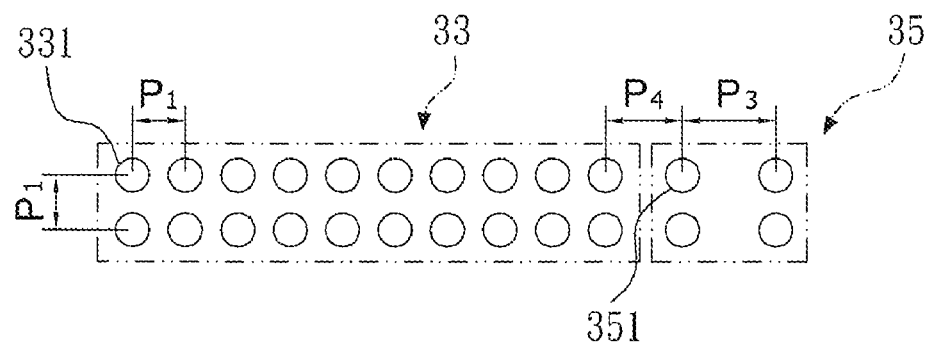
FIG. 9 is another embodiment of the first set of FIG. 4.

FIG. 9 shows another embodiment of the first set of FIG. 4. In this embodiment, the first mark through substrate vias 351 includes four mark through substrate vias that are arranged in two first mark rows, and the first original through substrate vias 331 are arranged in two first original rows. The first mark rows are aligned with the first original rows to form two rows.

Figure 10:
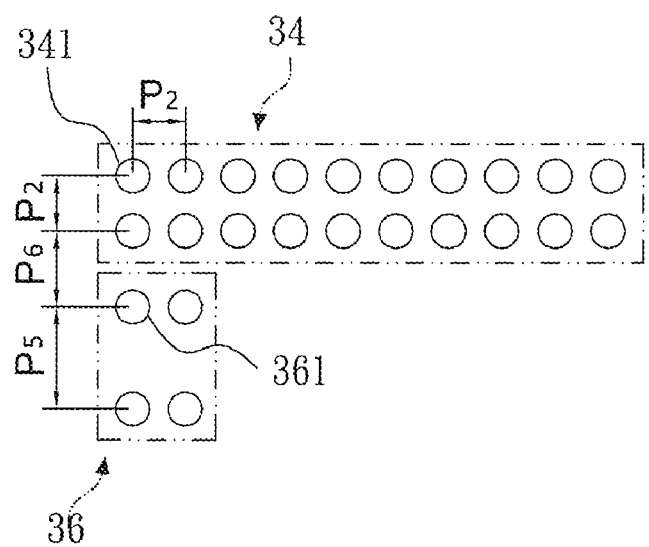
FIG. 10 is another embodiment of the second set of FIG. 4.

FIG. 10 shows another embodiment of the second set of FIG. 4. In this embodiment, the second mark through substrate vias 361 includes four mark through substrate vias that are arranged in two second mark columns, and the second original through substrate vias 341 are arranged in ten second original columns. The second mark columns are aligned with two of the second original columns, and they are in the same column respectively.

Figure 11:
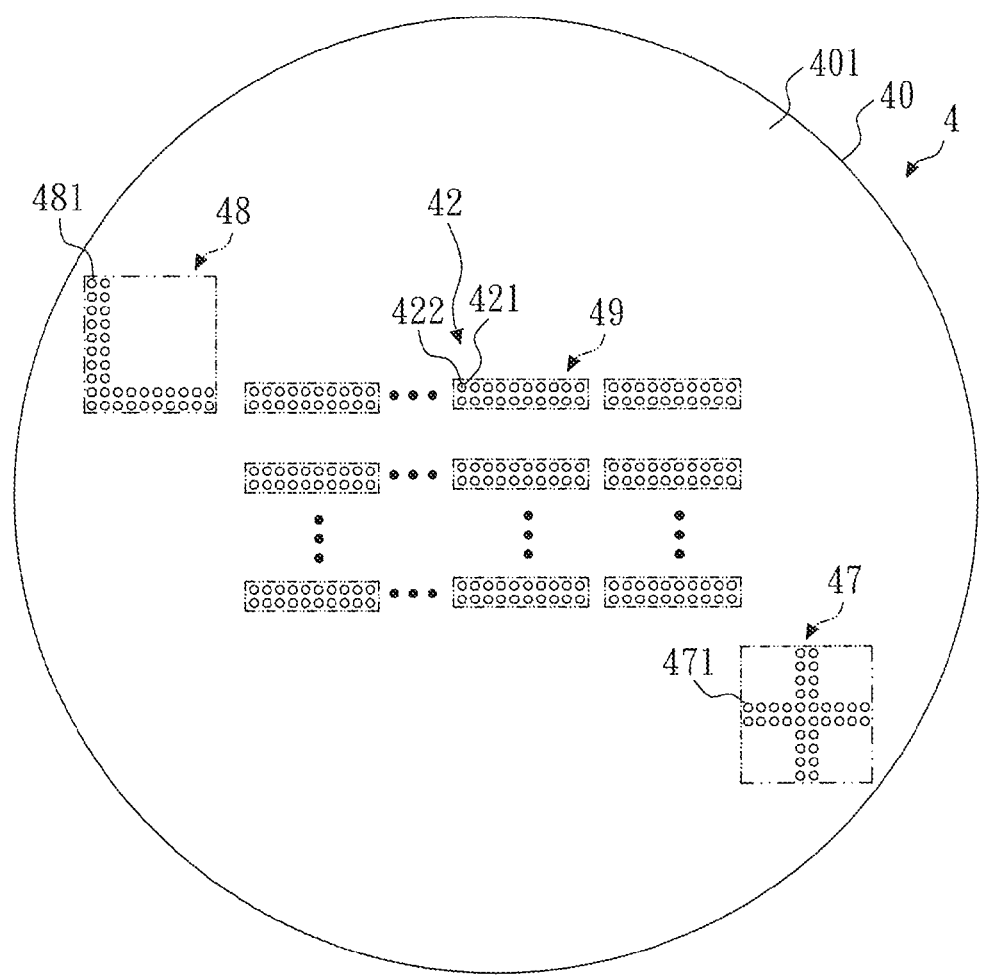
FIG. 11 is a schematic top view of a semiconductor device according to a second embodiment of the present invention.

FIG. 11 shows a schematic top view of a semiconductor device according to a second embodiment of the present invention. In this embodiment, the semiconductor device 4 is a semiconductor wafer and comprises a semiconductor substrate 40 and a plurality of original through substrate vias 42 and a plurality of mark through substrate vias (for example, the first mark through substrate vias 471 and the second mark through substrate vias 481). The semiconductor substrate 40 has a front surface (not shown) and a backside surface 401. The original through substrate vias 42 and the mark through substrate vias are disposed in the semiconductor substrate 40, and the back ends 421 of the original through substrate vias 42 and the mark through substrate vias are exposed (for example, protrude) from the backside surface 401. Preferably, the semiconductor device 4 further comprises a backside passivation (not shown) disposed on the backside surface 401. The original through substrate vias 42 and the mark through substrate vias further protrude from the backside passivation. A surface finish layer 422 is formed on the back ends 421 of the original through substrate vias 42 and the mark through substrate vias.

In the embodiment, the original through substrate vias 42 are conductive, and the mark through substrate vias are dummy. However, in other embodiment, the original through substrate vias 42 and the mark through substrate vias are all conductive. The original through substrate vias 42 are arranged in a plurality of original arrays 49, and each of the original arrays 49 has an original pattern, such as a square matrix.

The mark through substrate vias comprise a plurality of first mark through substrate vias 471 and a plurality of second mark through substrate vias 481. The first mark through substrate vias 471 are arranged in a first set 47 with a first pattern, and the second mark through substrate vias 481 are arranged in a second set 48 with a second pattern. The first set 47 is disposed at a first corner of the backside surface 401 of the semiconductor substrate 40, and the second set 48 is disposed at a second corner of the backside surface 401 of the semiconductor substrate 40. The first corner is opposite the second corner.

Figure 12:
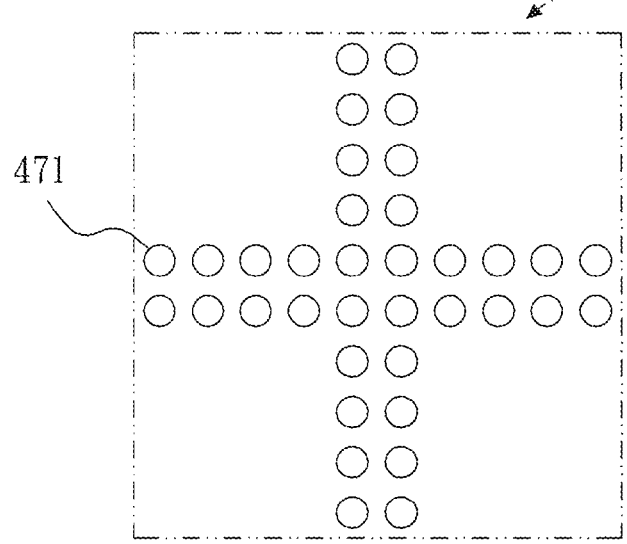
FIG. 12 is the first pattern of the first set of FIG. 11.

FIG. 12 shows the first pattern of the first set of FIG. 11. The first pattern of the first set 47 is a cross pattern. However, the first pattern of the first set 47 may be a L-shaped pattern or other patterns. The criteria is that the first pattern must be different from the original pattern.

Figure 13:
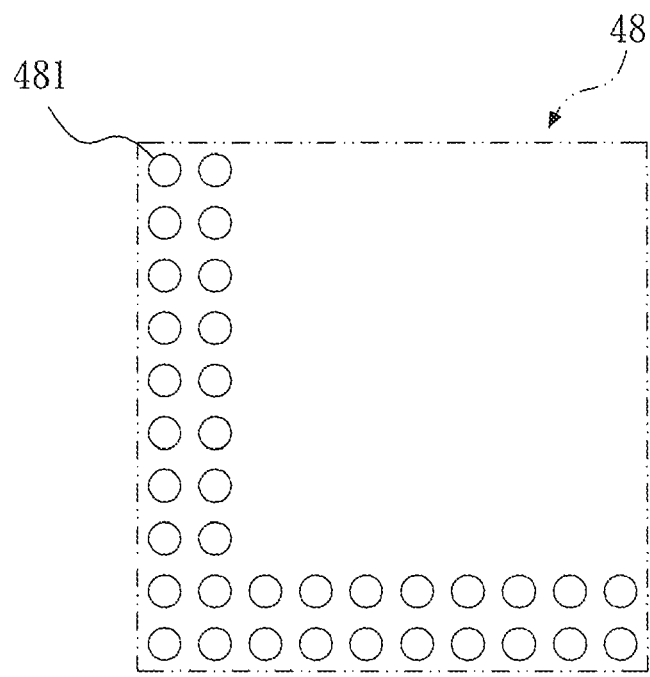
FIG. 13 is the second pattern of the second set of FIG. 11.

FIG. 13 shows the second pattern of the second set of FIG. 11. The second pattern of the second set 48 is a L-shaped pattern. However, the second pattern of the second set 48 may be a cross pattern or other patterns. The criterion is that the second pattern must be different from the original pattern.

Figure 14:
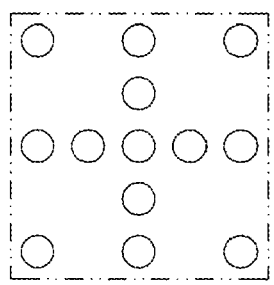
FIGS. 14 to 20 are other pattern examples of the first pattern and the second pattern.
Figure 15:
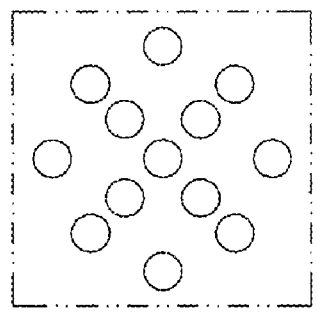
Figure 16:
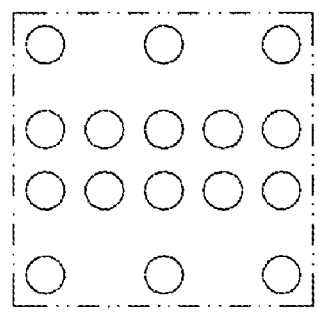
Figure 17:
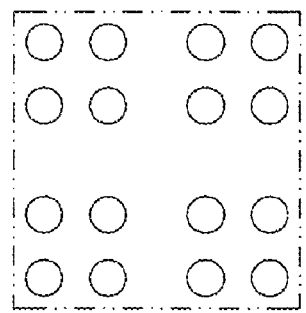
Figure 18:
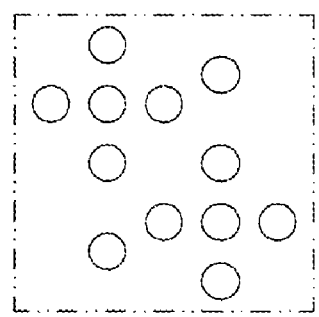
Figure 19:
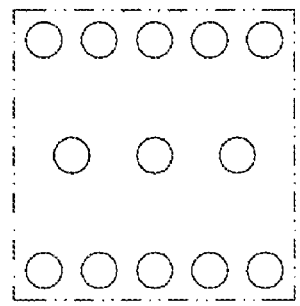
Figure 20:
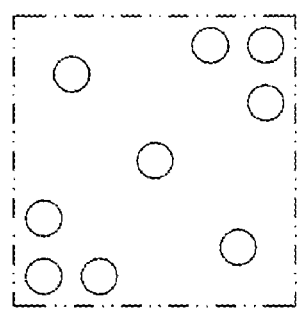

FIGS. 14 to 20 show other pattern examples of the first pattern and the second pattern. Referring to FIG. 14, the pattern comprises a cross shape and four points disposed at four corners of the first set or the second set. Referring to FIG. 15, the pattern is the pattern of FIG. 14 that rotates 45 degrees. Referring to FIG. 16, the pattern comprises a middle row and two side rows. The middle row is wide and dense. The side rows are narrow and rare, and are disposed on the two sides of the middle row. Referring to FIG. 17, the pattern comprises four portions disposed at four corners of the first set or the second set. Referring to FIG. 18, the pattern comprises two cross shapes and tow points. The cross shapes are disposed at two corners of the first set or the second set, and the points are disposed at other corners. Referring to FIG. 19, the pattern comprises a middle row and two side rows. The middle row is rare. The side rows are dense, and are disposed on the two sides of the middle row. Referring to FIG. 20, the pattern comprises two L shapes and an oblique line. The L shapes are disposed at two corners of the first set or the second set, and the oblique line is disposed between the L shapes.

Figure 21:
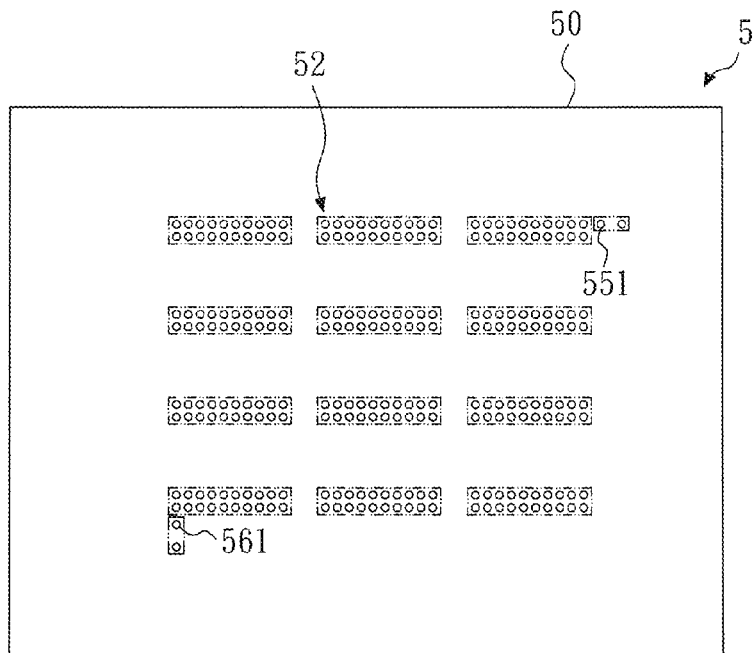
FIG. 21 is a schematic top view of a semiconductor device according to a third embodiment of the present invention.

FIG. 21 shows a schematic top view of a semiconductor device according to a third embodiment of the present invention. In this embodiment, the semiconductor device 5 is a semiconductor die that is cut form a semiconductor wafer. The semiconductor device 5 comprises a semiconductor substrate 50 and a plurality of original through substrate vias 52 and a plurality of mark through substrate vias (for example, the first mark through substrate vias 551 and the second mark through substrate vias 561).

The semiconductor substrate 50, the original through substrate vias 52 and the mark through substrate vias (for example, the first mark through substrate vias 551 and the second mark through substrate vias 561) are substantially same as the semiconductor substrate 30, the original through substrate vias 32 and the mark through substrate vias (for example, the first mark through substrate vias 351 and the second mark through substrate vias 361) of the first embodiment (FIG. 4) respectively.

Figure 22:
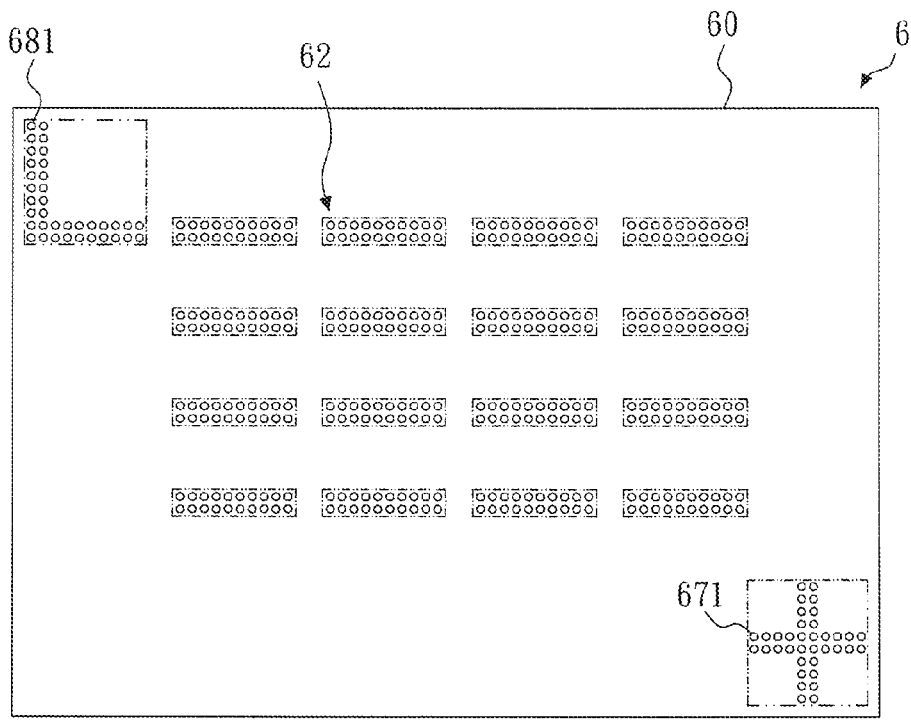
FIG. 22 is a schematic top view of a semiconductor device according to a fourth embodiment of the present invention.

FIG. 22 shows a schematic top view of a semiconductor device according to a fourth embodiment of the present invention. In this embodiment, the semiconductor device 6 is a semiconductor die that is cut form a semiconductor wafer. The semiconductor device 6 comprises a semiconductor substrate 60 and a plurality of original through substrate vias 62 and a plurality of mark through substrate vias (for example, the first mark through substrate vias 671 and the second mark through substrate vias 681).

The semiconductor substrate 60, the original through substrate vias 62 and the mark through substrate vias (for example, the first mark through substrate vias 671 and the second mark through substrate vias 681) are substantially same as the semiconductor substrate 40, the original through substrate vias 42 and the mark through substrate vias (for example, the first mark through substrate vias 471 and the second mark through substrate vias 481) of the second embodiment (FIG. 11) respectively.

The advantage of the present invention is that the mark through substrate vias are added to serve as a fiducial mark, which facilitates identifying the position and direction on the backside surfaces. Thus, the redistribution layer (RDL) or the special equipment for achieving the backside alignment (BSA) is not necessary.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A semiconductor device with a plurality of mark through substrate vias, comprising:
   a semiconductor substrate having a front surface and a backside surface;
   a plurality of original through substrate vias disposed in the semiconductor substrate, wherein the plurality of original through substrate vias comprise a plurality of first original through substrate vias and a plurality of second original through substrate vias, the plurality of first original through substrate vias are arranged in a first array, the plurality of second original through substrate vias are arranged in a second array, the pitch between two adjacent first original through substrate vias is defined as a first pitch, the pitch between two adjacent second original through substrate vias is defined as a second pitch; and a plurality of mark through substrate vias disposed in the semiconductor substrate and exposed from the backside surface, wherein the plurality of mark through substrate vias comprise a plurality of first mark through substrate vias and a plurality of second mark through substrate vias, the plurality of first mark through substrate vias are arranged in a first set, the plurality of second mark through substrate vias are arranged in a second set, the first set is disposed near the first array, the second set is disposed near the second array, the pitch between two adjacent first mark through substrate vias is defined as a third pitch, the pitch between the first original via nearest the first mark via and the first mark via is defined as a fourth pitch, the pitch between two adjacent second mark through substrate vias is defined as a fifth pitch, the pitch between the second original via nearest the second mark via and the second mark via is defined as a sixth pitch, wherein the third pitch is not equal to the fourth pitch, the third pitch and the fourth pitch are both indivisible by the first pitch, the fifth pitch is not equal to the sixth pitch, and the fifth pitch and the sixth pitch are both indivisible by the second pitch.

2. The semiconductor device as claimed in claim 1, wherein the semiconductor device is a semiconductor wafer or a semiconductor die.

3. The semiconductor device as claimed in claim 1, wherein the plurality of original through substrate vias are conductive, and the plurality of mark through substrate vias are dummy.

4. The semiconductor device as claimed in claim 1, wherein the plurality of original through substrate vias and the plurality of mark through substrate vias are all conductive.

5. The semiconductor device as claimed in claim 1, wherein the first array is disposed at a first corner of the whole original through substrate vias, the second array is disposed at a second corner of the whole original through substrate vias, and the first corner is opposite the second corner.

6. The semiconductor device as claimed in claim 1, wherein the first set is disposed near a corner of the first array.

7. The semiconductor device as claimed in claim 1, wherein the second set is disposed near a corner of the second array.

8. The semiconductor device as claimed in claim 1, wherein the plurality of first mark through substrate vias are arranged in at least one first mark row, the plurality of first original through substrate vias are arranged in at least one first original row, and the first mark row and the first original row are in the same row.

9. The semiconductor device as claimed in claim 1, wherein the plurality of first mark through substrate vias are arranged in at least one first mark column, the plurality of first original through substrate vias are arranged in at least one first original column, and the first mark column and the first original column are in the same column.

10. The semiconductor device as claimed in claim 1, wherein the plurality of second mark through substrate vias are arranged in at least one second mark row, the plurality of second original through substrate vias are arranged in at least one second original row, and the second mark row and the second original row are in the same row.

11. The semiconductor device as claimed in claim 1, wherein the plurality of second mark through substrate vias are arranged in at least one second mark column, the plurality of second original through substrate vias are arranged in at least one second original column, and the second mark column and the second original column are in the same column.

12. A semiconductor device with a plurality of mark through substrate vias, comprising:

a semiconductor substrate having a front surface and a backside surface;

a plurality of original through substrate vias disposed in the semiconductor substrate, wherein the plurality of original through substrate vias are arranged in a plurality of original arrays, each of the original arrays has an original pattern; and a plurality of mark through substrate vias disposed in the semiconductor substrate and exposed from the backside surface, wherein the plurality of mark through substrate vias comprise a plurality of first mark through substrate vias and a plurality of second mark through substrate vias, the plurality of first mark through substrate vias are arranged in a first set with a first pattern, the plurality of second mark through substrate vias are arranged in a second set with a second pattern, the first set is disposed at a first corner of the backside surface, the second set is disposed at a second corner of the backside surface, the first corner is opposite the second corner, and the first pattern and the second pattern are both different from the original pattern.

13. The semiconductor device as claimed in claim 12, wherein the semiconductor device is a semiconductor wafer or a semiconductor die.

14. The semiconductor device as claimed in claim 12, wherein the plurality of original through substrate vias are conductive, and the plurality of mark through substrate vias are dummy.

15. The semiconductor device as claimed in claim 12, wherein the plurality of original through substrate vias and the plurality of mark through substrate vias are all conductive.

16. The semiconductor device as claimed in claim 12, wherein the original pattern is a square matrix.

17. The semiconductor device as claimed in claim 12, wherein the first pattern is a cross pattern or L-shaped pattern.

18. The semiconductor device as claimed in claim 12, wherein the second pattern is a cross pattern or L-shaped pattern.

* * * * *